United States Patent
Miyazaki et al.

(10) Patent No.: US 7,034,341 B2
(45) Date of Patent: Apr. 25, 2006

(54) SEMICONDUCTOR LASER DEVICE HAVING A MULTI-LAYER BUFFER LAYER

(75) Inventors: Keisuke Miyazaki, Ikoma (JP); Kazuhiko Wada, Yamatokooriyama (JP); Taiji Morimoto, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 243 days.

(21) Appl. No.: 10/412,280

(22) Filed: Apr. 14, 2003

(65) Prior Publication Data

US 2003/0197204 A1 Oct. 23, 2003

(30) Foreign Application Priority Data

Apr. 15, 2002 (JP) ......................... 2002-112155

(51) Int. Cl.
*H10L 33/12* (2006.01)

(52) U.S. Cl. .................. 257/89; 257/96; 438/22; 438/44

(58) Field of Classification Search .......... 257/89, 257/96–99; 438/22, 48; 375/50, 43–46
See application file for complete search history.

(56) References Cited

U.S. PATENT DOCUMENTS 6,546,035 B1 * 4/2003 Imafuji et al. ............... 375/50
6,643,310 B1 * 11/2003 Nemoto ........................ 372/50
6,680,958 B1 * 1/2004 Nemoto ........................ 372/43

FOREIGN PATENT DOCUMENTS

| EP | 0989642 A2 | 3/2000 |
|---|---|---|
| JP | 01-204487 | 8/1989 |
| JP | 03-009589 | 1/1991 |
| JP | 03-127889 | 5/1991 |
| JP | 06-029618 | 2/1994 |
| JP | 09-036487 | 2/1997 |
| JP | 10-233550 | 9/1998 |
| JP | 2000-299529 | 10/2000 |

* cited by examiner

Primary Examiner—Dung A. Le
(74) Attorney, Agent, or Firm—Morrison & Foerster LLP

(57) ABSTRACT

An AlGaAs-based semiconductor laser 29 is formed on an n-type GaAs substrate 21 and thereafter etching is carried out until reaching an n-type AlGaAs clad layer 23 from the surface. Next, the n-type AlGaAs clad layer 23 is removed by etching with an etchant having selectivity to GaAs. Subsequently, the surface of an n-type GaAs buffer layer 22 is lightly etched. Thus, the n-type GaAs buffer layer 22 of the AlGaAs-based semiconductor laser 29 is left in a slightly abraded state on the n-type GaAs substrate 21, maintaining the flatness of the groundwork layer during growing an AlGaInP-based semiconductor laser 38 at the second time. Therefore, the flatness of the crystals of, in particular, an active layer grown at the second time can be improved, and the poor characteristics of the AlGaInP-based semiconductor laser 38 attributed to the poor flatness of the groundwork can be improved.

3 Claims, 7 Drawing Sheets

FIRST-TIME CRYSTAL GROWTH

PARTIAL REMOVAL OF FIRST-TIME CRYSTAL GROWTH LAYER

ETCHANT OF SULFURIC ACID SYSTEM
ETCHANT OF HF SYSTEM OR HYDROCHLORIC ACID SYSTEM
ETCHANT OF SULFURIC ACID SYSTEM OR $NH_3$ SYSTEM

SECOND-TIME CRYSTAL GROWTH

PARTIAL REMOVAL OF SECOND-TIME CRYSTAL GROWTH LAYER

SEPARATION BETWEEN FIRST-TIME AND SECOND-TIME GROWTH LAYERS

FORMATION OF LIGHT CONFINEMENT STRUCTURE, CURRENT CONFINEMENT STRUCTURE AND ELECTRODES

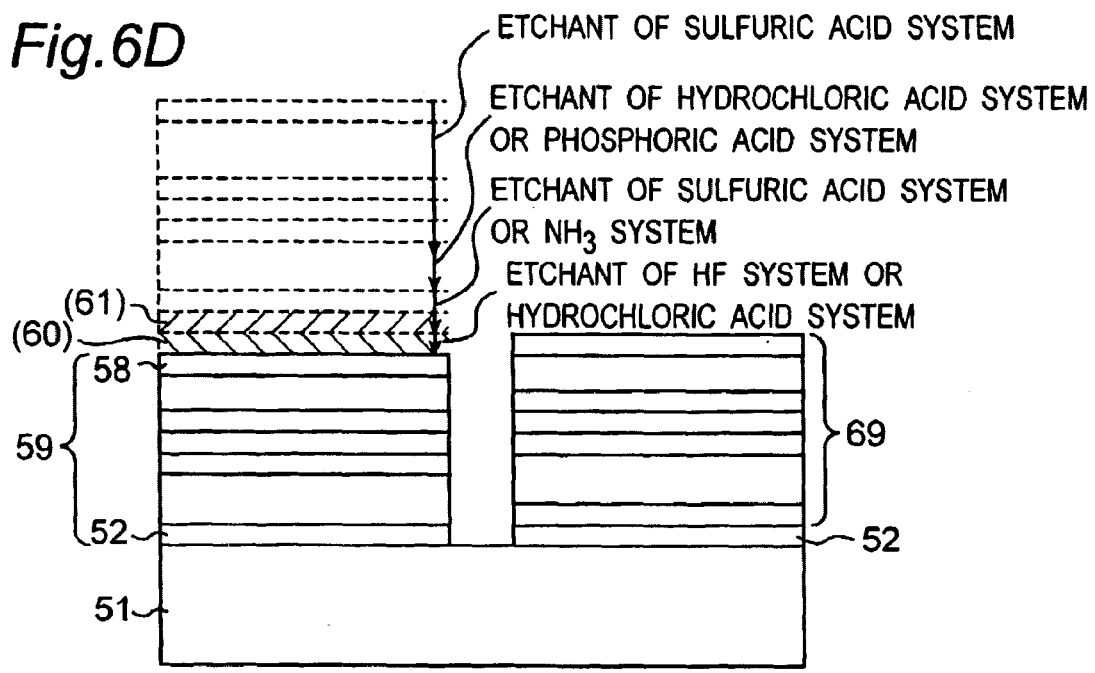
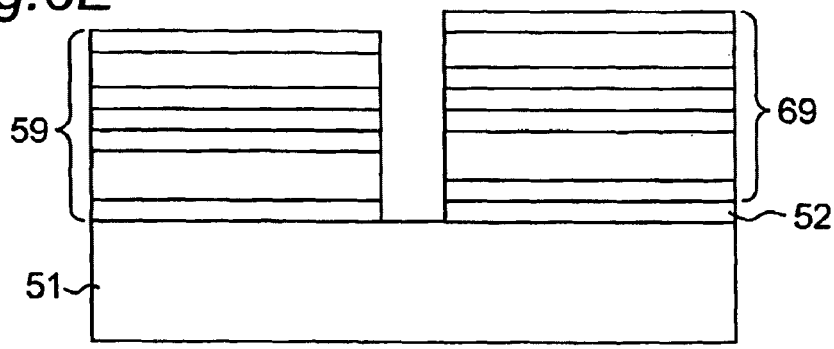
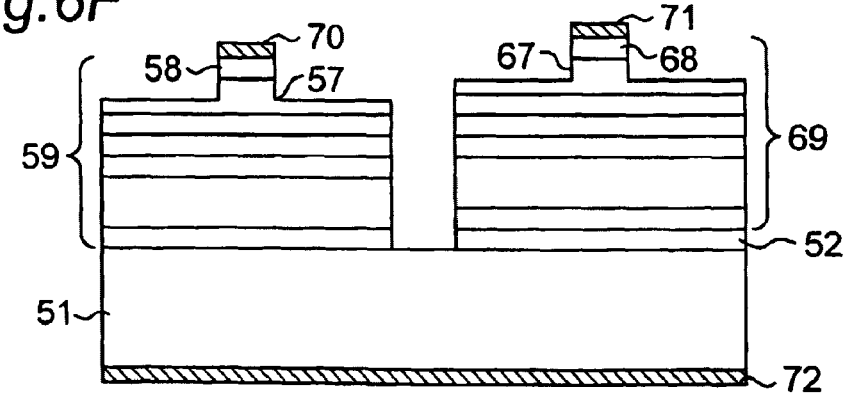

SEMICONDUCTOR LASER DEVICE HAVING A MULTI-LAYER BUFFER LAYER

BACKGROUND OF THE INVENTION

The present invention relates to a semiconductor laser device fabricating method capable of forming a plurality of semiconductor lasers on one semiconductor substrate.

In recent years, optical disks have been popularized, and their recording formats have had many divergences. When optical disks of different standards are optically read, lasers of different standards are needed. For example, in order to read two types of optical discs of a CD (Compact Disc) and a DVD (Digital Versatile Disc), an infrared laser of an emission wavelength at and around 780 nm and a red laser of an emission wavelength at and around 650 nm are needed.

In the above case, there is demanded the appearance of a semiconductor laser device capable of emitting laser beams of two wavelengths in one package for the size reduction and cost reduction of the pickup.

Moreover, besides the optical disks, there is demanded the appearance of a semiconductor laser device capable of emitting laser beams of two wavelengths in one package or two kinds of lasers for a low output use and a high output use even at same wavelength for laser beam printers and rewritable optical disks. Furthermore, a two-beam laser device of same wavelength and same output can be considered.

In order to meet these demands, a technology for integrating two semiconductor lasers on one semiconductor substrate is developed. However, when lasers of two different characteristics are formed on a single semiconductor substrate, it is often impossible to materialize such a device through one-time crystal growth. Therefore, a method for carrying out crystal growth a plurality of times on a single semiconductor substrate is used. That is, one laser structure is precedingly crystallinically grown on a semiconductor substrate, the other laser structure is formed while being superposedly grown on it, and the succeedingly formed laser structure is removed from the precedingly grown laser structure. When the other laser structure is grown while being superposed on the precedingly crystallinically grown laser structure in the above case, the laser structure crystallinically grown at the first time is partially etched to expose the semiconductor substrate, and the second-time crystal growth is carried out on the substrate.

FIGS. 8A and 8B show the cross section of the device when two semiconductor lasers of an AlGaAs-based semiconductor laser and an AlGaInP-based semiconductor laser are grown on a GaAs substrate 1. First of all, as shown in FIG. 8A, an AlGaAs-based semiconductor laser 9 constructed of an n-type GaAs buffer layer 2, an n-type AlGaAs clad layer 3, an AlGaAs guide layer 4, a multiple quantum well active layer 5, a p-type AlGaAs guide layer 6, a p-type AlGaAs clad layer 7, and a p-type GaAs contact layer (doped with Zn) 8 is grown on an n-type GaAs substrate 1. Then, the AlGaAs-based semiconductor laser 9 is partially removed by etching until the GaAs substrate 1 is exposed.

Thereafter, as shown in FIG. 8B, an AlGaInP-based semiconductor laser 18 constructed of an n-type GaAs buffer layer 11, an n-type AlGaInP clad layer 12, an AlGaInP guide layer 13, a multiple quantum well active layer 14, an AlGaInP guide layer 15, a p-type AlGaInP clad layer 16 and a p-type GaAs contact layer 17 is grown on the entire surface.

As described above, the AlGaAs-based semiconductor laser 9 crystallinically grown at the first time is partially etched to expose the GaAs substrate 1, and thereafter, the second-time crystal growth is carried out. The reason for the above is that two growth interfaces of the first-time growth interface and the second-time growth interface are disadvantageously included in the laser structure formed by the second-time crystal growth unless the removal is effected to the semiconductor substrate.

However, the aforementioned conventional semiconductor laser device fabricating method for carrying out a plurality of times the crystal growth on the single semiconductor substrate has the following problems. That is, as described above, the GaAs substrate 1 is exposed by partially etching the AlGaAs-based semiconductor laser 9 crystallinically grown at the first time. In the above case, removal is effected to the GaAs substrate 1 by concurrently using an etchant of sulfuric acid system or hydrochloric acid system or $NH_3$ system and an etchant of HF system. Then, the second-time crystal growth is carried out on the exposed surface of the GaAs substrate 1.

However, if etching is effected to the semiconductor substrate as described above, there is a problem that the flatness of the etching surface is worsened, and the poor flatness influences the crystal to be grown at the second-time crystal growth, exerting adverse influence on the characteristic surface of the grown semiconductor laser. In particular, when a multiple quantum well layer in which very thin film layers are laminated is used as the active layer of the semiconductor laser, control of film thickness is very important. Therefore, the poor flatness of the groundwork layer exerts enormous influence on the degradation of the characteristics of the multiple quantum well layer.

SUMMARY OF THE INVENTION

Accordingly, the object of the present invention is to provide a fabricating method of a semiconductor laser device that has a plurality of semiconductor lasers capable of improving the characteristics of the semiconductor laser grown at the second time by flattening the groundwork for the second-time crystal growth and a semiconductor laser device fabricated by the fabricating method.

In order to achieve the above object, there is provided a semiconductor laser device in which a plurality of semiconductor laser layers are arranged parallel on a semiconductor substrate, wherein one of mutually adjacent two semiconductor laser layers has in its lowermost layer a buffer layer formed simultaneously with a buffer layer of the other semiconductor laser layer. Therefore, the one semiconductor laser layer is to be formed on the buffer layer formed simultaneously with the buffer layer of the other semiconductor laser layer.

That is, there is no need for completely removing by etching a certain portion located in the region of the succeedingly formed semiconductor laser layer in the buffer layer of the precedingly formed semiconductor laser layer, and the flatness of the groundwork layer is maintained during succeeding growth of the semiconductor laser layer. Thus, the flatness of the groundwork layer is improved in comparison with the case where the semiconductor substrate is exposed by removing by etching the buffer layer of the precedingly formed semiconductor laser layer, and the flatness of the crystals of the succeedingly formed semiconductor laser layer (particularly the active layer) is improved.

Also, there is provided a semiconductor laser device in which a plurality of semiconductor laser layers are arranged parallel on a semiconductor substrate, wherein the semiconductor laser layers are each provided with a buffer layer shared with the adjacent other semiconductor laser layer. Therefore, either one of the mutually adjacent semiconductor laser layers can be formed on the buffer layer shared with the other semiconductor laser layer.

In this case, there is no need for completely removing by etching a certain portion located in the region of the one semiconductor laser layer in the buffer layer shared with the other semiconductor laser layer, and the flatness of the groundwork layer is maintained during succeeding growth of the semiconductor laser layer. Thus, the flatness of the ground-work layer is improved in comparison with the case where the semiconductor substrate is exposed by removing by etching the buffer layer of the other semiconductor laser layer, and the flatness of the crystals of the one semiconductor laser layer (particularly the active layer) is improved.

Also, there is provided a semiconductor laser device fabricating method for forming a semiconductor laser device having a plurality of light-emitting regions, the method comprising the steps of:

forming a first semiconductor laser layer including a buffer layer located in a lowermost position and a contact layer located in an uppermost position on a semiconductor substrate by first-time crystal growth;

removing a region except for a region that becomes a light-emitting region of the first semiconductor laser layer leaving a rear surface side of the buffer layer remaining;

forming a second semiconductor laser layer by second-time crystal growth; and exposing the contact layer of the first semiconductor laser layer by removing a region except for a region that becomes a light-emitting region of the second semiconductor laser layer. Therefore, by removing the region by etching, the flatness of the groundwork layer is maintained during forming the second semiconductor laser layer by second-time crystal growth. Thus, the flatness of the groundwork layer is improved in comparison with the case where the semiconductor substrate is exposed by etching the buffer layer of the first semiconductor laser layer formed first, and the flatness of the crystals of the second semiconductor laser layer (particularly the active layer) formed secondly is improved.

Also, there is provided a semiconductor laser device fabricating method for forming a semiconductor laser device having a plurality of light-emitting regions, the method comprising the steps of:

forming a first semiconductor laser layer including a buffer layer located in a lowermost position and a contact layer located in an uppermost position on a semiconductor substrate by first-time crystal growth;

removing a region except for a region that becomes a light-emitting region of the first semiconductor laser layer leaving the buffer layer remaining;

forming a second semiconductor laser layer by second-time crystal growth; and exposing the contact layer of the first semiconductor laser layer by removing a region except for a region that becomes a light-emitting region of the second semiconductor laser layer. Therefore, the flatness of the groundwork layer is maintained during forming the second semiconductor laser layer by second-time crystal growth. Thus, the flatness of the groundwork layer is improved in comparison with the case where the semiconductor substrate is exposed by etching the buffer layer of the first semiconductor laser layer formed first, and the flatness of the crystals of the second semiconductor laser layer (particularly the active layer) formed secondly is improved.

Furthermore, when the buffer layers of the first and second semiconductor laser layers have the same composition, it becomes possible to omit the formation of a new buffer layer for the second semiconductor laser layer on the buffer layer of the completely remaining first semiconductor laser layer.

Furthermore, when the p-type AlGaAs clad layer of the first semiconductor laser layer or the p-type AlGaInP clad layer of the second semiconductor laser layer is partway removed by etching with an etchant, an etching stop layer that is not etched by the etchant may be provided within the clad layer in order to enhance the controllability of etching. As the etching stop layer, for example, GaAs and GaInP layers are used for the p-type AlGaAs and AlGaInP clad layers, respectively.

In one embodiment of the present invention, at least the step for removing a partial region of the first semiconductor laser layer leaving the buffer layer remaining and the step for forming the second semiconductor laser layer are repetitively carried out. Therefore, by regarding the second semiconductor laser layer formed by the second-time crystal growth as the first semiconductor laser layer formed by the first-time crystal growth, removing part of this first semiconductor laser layer (originally the second semiconductor laser layer) with the buffer layer left and forming the second semiconductor laser layer (originally the third semiconductor laser layer) on the buffer layer left, three semiconductor lasers having high performance and high reliability can be formed on an identical semiconductor substrate.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 6D through 6F are sectional views in the fabricating processes continued from FIG. 5C;

DETAILED DESCRIPTION OF THE PREFERRED EMBODIMENTS

Figure 1A:
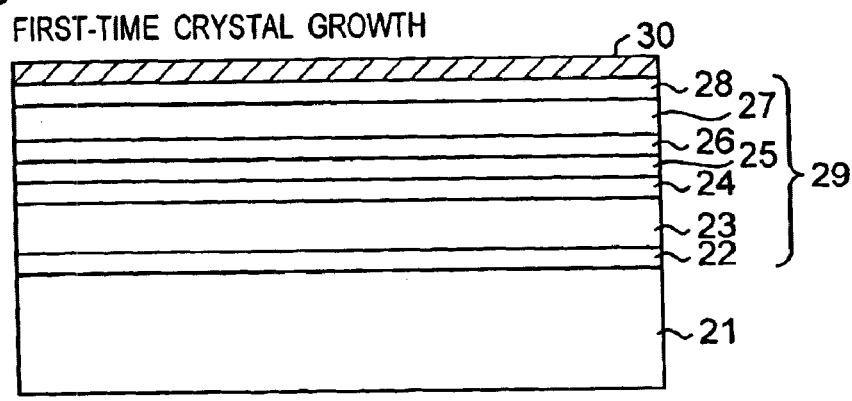
FIGS. 1A through 1C are sectional views of a semiconductor laser device formed by a semiconductor laser device fabricating method of the present invention, in the fabricating processes.

The present invention will be described in detail below on the basis of the embodiments shown in the drawings. As described above, as a result of forming an AlGaAs-based semiconductor laser on a GaAs substrate and observing the etching state in detail in removing its partial region by etching, the following facts have been discovered.

That is, when the AlGaAs clad layer on the GaAs buffer layer is etched with an etchant capable of carrying out selective etching, the GaAs buffer layer is not etched at all, and therefore, the etching surface is flat. Furthermore, if etching is carried out with, for example, an etchant of sulfuric acid system or $NH_3$ system in order to expose the GaAs substrate by removing this GaAs buffer layer, then the surface flatness becomes worsened. Then, in the above case, the etchant having selectivity cannot be used because there is only the GaAs layer in the downward direction (toward the substrate) below the GaAs buffer layer, and the flatness, which is worsened once, cannot be recovered.

Therefore, it is effective to carry out crystal growth for the second-time formation of a semiconductor laser on the semiconductor substrate in a state in which the buffer layer of the first-time semiconductor laser is completely left or in a state in which the buffer layer is slightly abraded away.

(First Embodiment)

In the present embodiment, the buffer layer of the semiconductor laser formed at the first time is left in a state in which it is slightly abraded away, and the crystal growth for the second-time formation of the semiconductor laser is carried out on the layer.

FIGS. 1A through 1C and 2D through 2F show the cross sections of a semiconductor laser device in the fabricating processes, the device being formed by the semiconductor laser device fabricating method of this embodiment. First of all, as shown in FIG. 1A, an n-type GaAs buffer layer 22, an n-type AlGaAs clad layer 23, an AlGaAs guide layer 24, a multiple quantum well active layer 25, a p-type AlGaAs guide layer 26, a p-type AlGaAs clad layer 27 and a p-type GaAs contact layer (doped with Zn) 28 are successively formed on an n-type GaAs substrate 21 by MOCVD (Metal-Organic Chemical Vapor Deposition), forming an AlGaAs-based semiconductor laser 29 as one example of the first semiconductor laser layer.

Further, a non-doped GaAs protective layer 30 is formed to a film thickness of 0.2 μm on the p-type GaAs contact layer 28 of the AlGaAs-based semiconductor laser 29. Thus, first-time crystal growth is carried out.

Figure 1B:
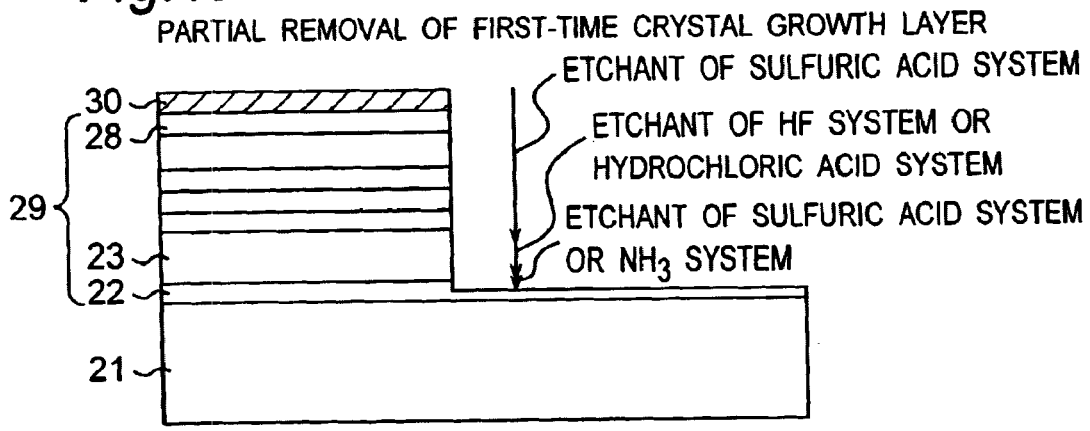

Next, as shown in FIG. 1B, a partial region of the AlGaAs-based semiconductor laser 29 is removed by etching and the n-type GaAs buffer layer 22 is left remaining. In concrete, etching is first carried out with an etchant of sulfuric acid system until reaching the n-type AlGaAs clad layer 23. Next, the remaining n-type AlGaAs clad layer 23 is removed by etching with an etchant of HF system or hydrochloric acid system. Since GaAs cannot be etched with the above-mentioned etchant, the etching stops at the surface of the n-type GaAs buffer layer 22. Thus, the surface of the n-type GaAs buffer layer 22 is lightly etched with an etchant of sulfuric acid system or $NH_3$ system.

In this case, the non-doped GaAs protective layer 30 is formed on the p-type GaAs contact layer 28 of the AlGaAs-based semiconductor laser 29 remaining on the n-type GaAs substrate 21. Therefore, when the n-type GaAs substarate is put in a growth furnace for the second-time growth of the semiconductor laser, the evaporation of the impurity Zn from the p-type GaAs contact layer 28 due to high temperature in the furnace is prevented so that the surface carrier density of the contact layer is prevented from reducing.

Figure 1C:
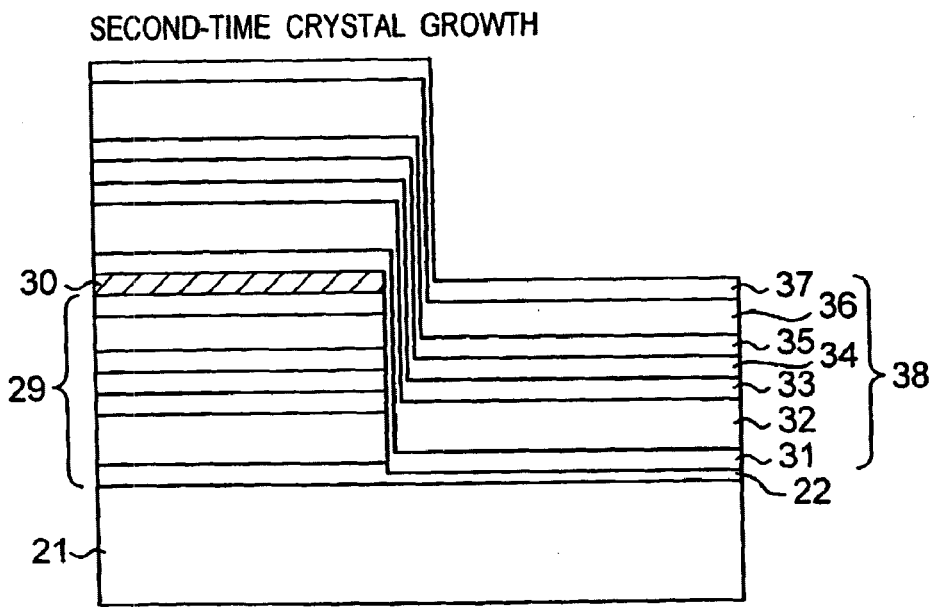

Next, as shown in FIG. 1C, an n-type GaAs buffer layer 31, an n-type AlGaInP clad layer 32, an AlGaInP guide layer 33, a multiple quantum well active layer 34, an AlGaInP guide layer 35, a p-type AlGaInP clad layer 36 and a p-type GaAs contact layer 37 are successively formed on the entire surface by MOCVD, forming an AlGaInP-based semiconductor laser 38 as one example of the second semiconductor laser layer. Thus, second-time crystal growth is carried out. In FIG. 1C, the layers are illustrated so as to be bent at right angles and perpendicularly extended at the boundary between the AlGaInP-based semiconductor laser 38 grown on the GaAs substrate 21 and the AlGaInP-based semiconductor laser 38 grown on the AlGaAs-based semiconductor laser 29. However, the layers are practically formed so as to be gently curved.

Figure 2D:
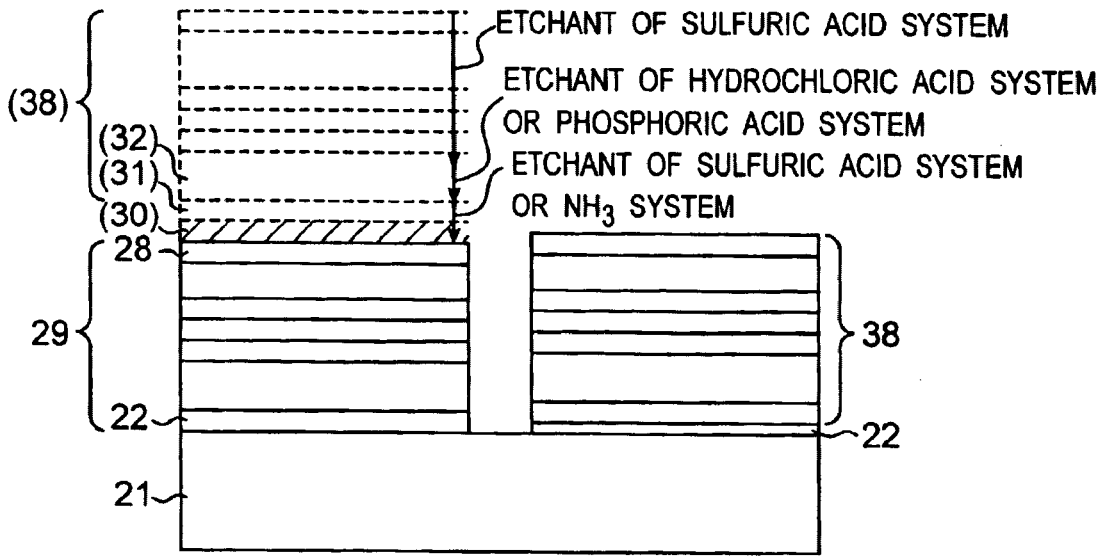
FIGS. 2D through 2F are sectional views in the fabricating processes continued from FIG. 1C.

Next, as shown in FIG. 2D, a region, which belongs to the succeedingly formed AlGaInP-based semiconductor laser 38 and is formed while being superposed on the precedingly formed AlGaAs-based semiconductor laser 29, and the non-doped GaAs protective layer 30 are removed by etching.

In concrete, etching is first carried out until reaching the n-type AlGaInP clad layer 32 of the AlGaInP-based semiconductor laser 38 with an etchant of sulfuric acid system. Next, the remaining n-type AlGaInP clad layer 32 is etched to the n-type GaAs buffer layer 31 with an etchant of hydrochloric acid system or phosphoric acid system. In this case, since the etchant having selectivity is used, the etching stops on the n-type GaAs buffer layer 31. Subsequently, the n-type GaAs buffer layer 31 and the non-doped GaAs protective layer 30 are removed by etching with an etchant of sulfuric acid system or an etchant of $NH_3$ system to expose the p-type GaAs contact layer 28 of the AlGaAs-based semiconductor laser 29.

Figure 2E:
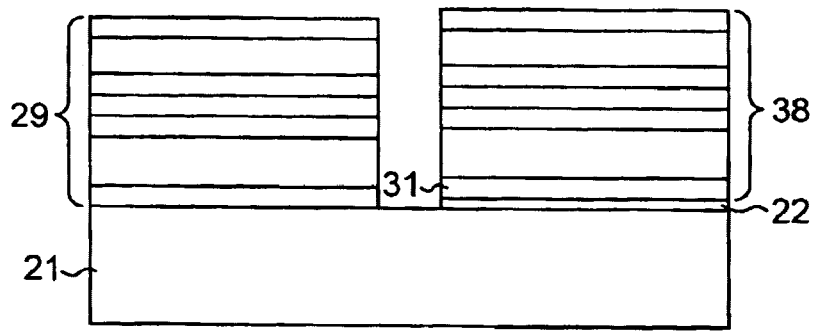

Further, a region located at the boundary between the AlGaAs-based semiconductor laser 29 and the AlGaInP-based semiconductor laser 38 on the n-type GaAs substrate 21 is removed until the n-type GaAs substrate is exposed, forming a semiconductor laser device in which the AlGaAs-based semiconductor laser 29 and the AlGaInP-based semiconductor laser 38 are arranged parallel on the n-type GaAs substrate 21, as shown in FIG. 2E. In this case, it is, of course, acceptable to leave the n-type GaAs buffer layer 22 at the boundary between the AlGaAs-based semiconductor laser 29 and the AlGaInP-based semiconductor laser 38.

Figure 2F:
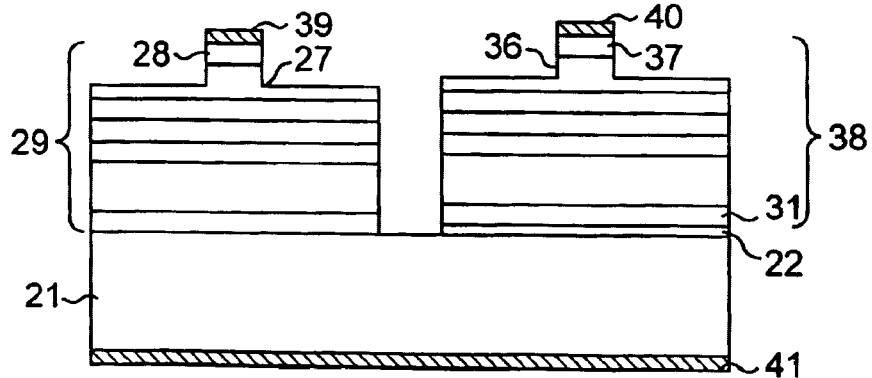

Subsequently, as shown in FIG. 2F, the p-type GaAs contact layer 28 and the p-type AlGaAs clad layer 27 of the AlGaAs-based semiconductor laser 29 are removed by etching entirely and partway, respectively, with a center portion left by a prescribed width in the direction perpendicular to the sheet plane of the figure, forming a stripe-shaped ridge portion in the center portion. At the same time, the p-type GaAs contact layer 37 and the p-type AlGaInP clad layer 36 of the AlGaInP-based semiconductor laser 38 are removed by etching entirely and partway, respectively, forming a stripe-shaped ridge portion in the center portion. Then, p-type AuZn/Au/Mo/Au electrodes 39 and 40 are formed on the ridge portion of the AlGaAs-based semiconductor laser 29 and on the ridge portion of the AlGaInP-based semiconductor laser 38. Further, an n-type AuGe/Ni/Mo/Au electrode 41 is formed on the surface of the n-type GaAs substrate 21. Thus, the semiconductor laser device, which has two light-emitting portions, is formed.

Figure 3:
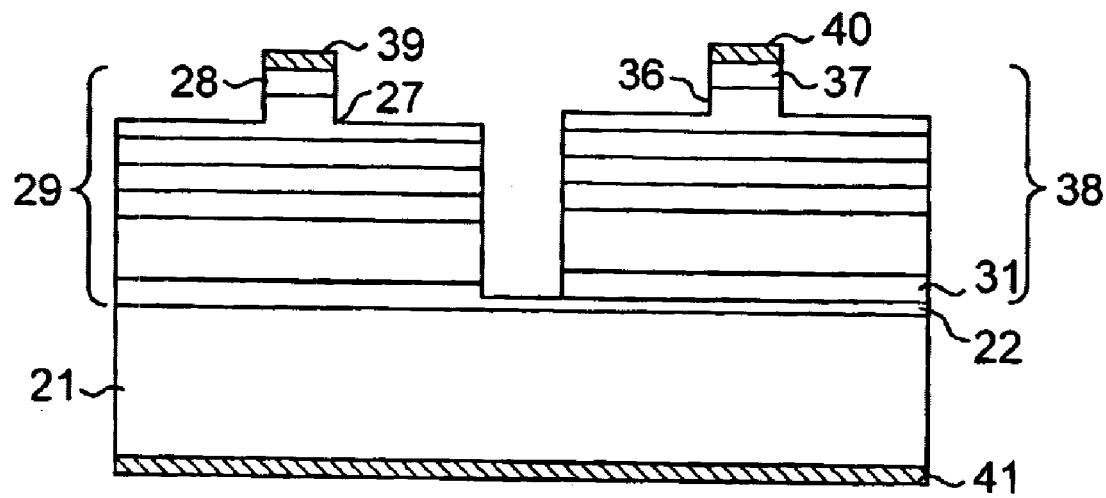
FIG. 3 is a sectional view showing another example of a semiconductor laser device formed by the fabricating method of the semiconductor laser device shown in FIGS. 1A through 1C and 2D through 2F.

As described above, when the n-type GaAs buffer layer 22 is left at the boundary between the AlGaAs-based semiconductor laser 29 and the AlGaInP-based semiconductor laser 38, a semiconductor laser device as shown in FIG. 3 is formed.

As described above, in the present embodiment, the AlGaAs-based semiconductor laser 29 is formed on the n-type GaAs substrate 21, and thereafter, etching is carried out until reaching the n-type AlGaAs clad layer 23 from the surface. Next, the n-type AlGaAs clad layer 23 is removed by etching with an etchant of HF system or hydrochloric acid system having selectivity to GaAs. Subsequently, the surface of the n-type GaAs buffer layer 22 is lightly etched with an etchant of sulfuric acid system or $NH_3$ system.

Therefore, by leaving the n-type GaAs buffer layer 22 of the AlGaAs-based semiconductor laser 29 formed at the first time on the n-type GaAs substrate 21 in a state in which the buffer layer 22 is slightly abraded away, the flatness of the groundwork layer can be maintained during growing the AlGaInP-based semiconductor laser 38 at the second time. Thus, the flatness of the groundwork layer can be improved in comparison with the case where the n-type GaAs substrate 21 is exposed by removing by etching the n-type GaAs buffer layer 22, and the flatness of the crystals of, in particular, the active layer can be improved at the second-time growth.

That is, according to this embodiment, the poor characteristic of the AlGaInP-based semiconductor laser 38 that is grown and formed at the second time attributed to the poor flatness of the groundwork layer can be improved.

Figure 4A:
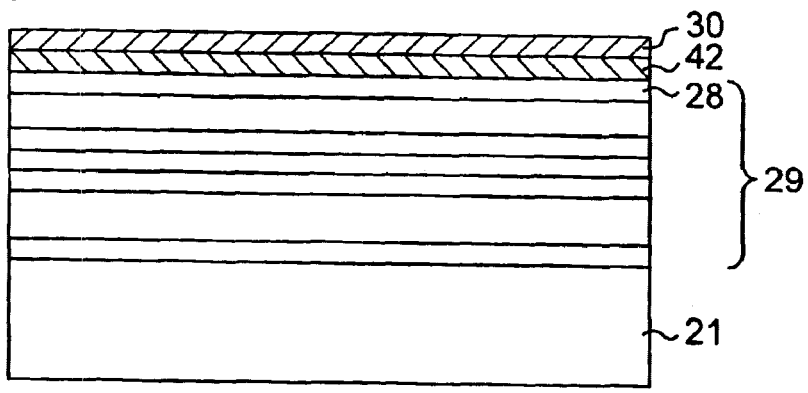
FIGS. 4A through 4C are sectional views showing a modification example of the fabricating method of the semiconductor laser device shown in FIGS. 1A through 1C.
Figure 4B:
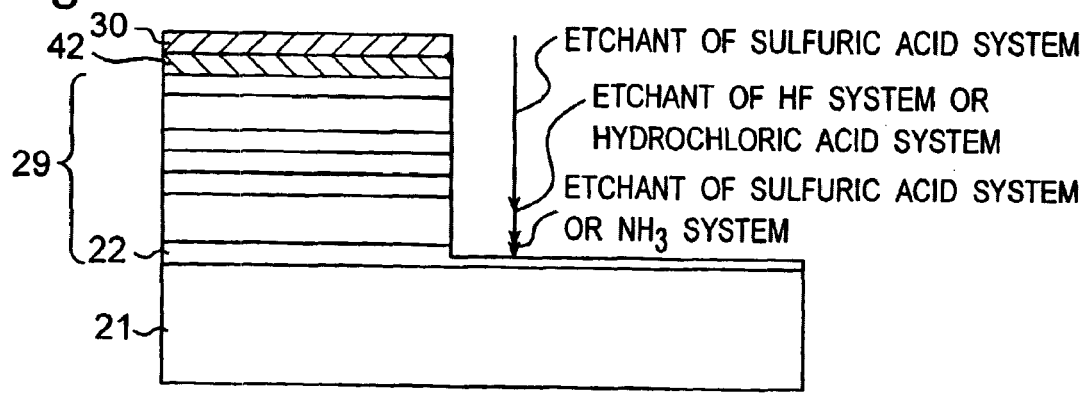
Figure 4C:
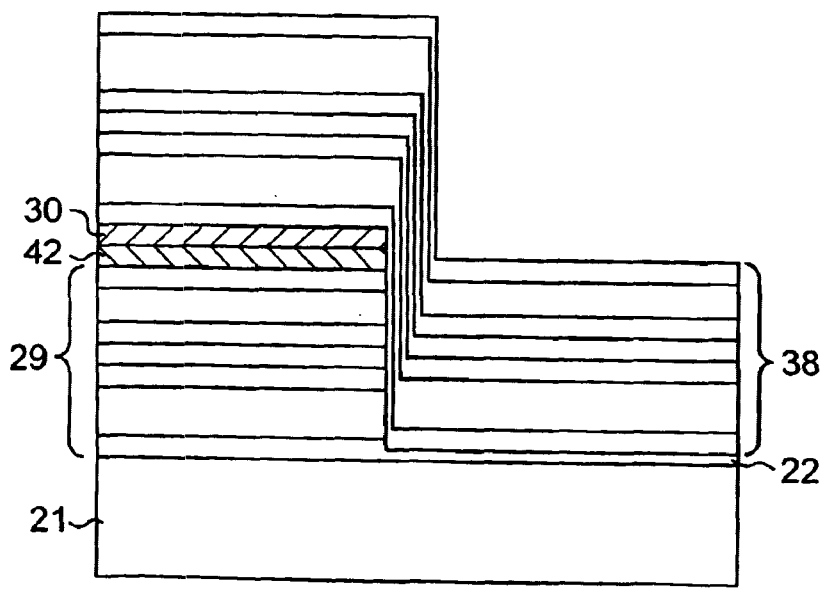

As a modification example of the present embodiment, as shown in FIGS. 4A through 4C, it is acceptable to form an AlGaAs-based semiconductor laser 29 on an n-type GaAs substrate 21 and thereafter provide an AlGaAs-based non-doped AlGaAs etching stop layer 42 of a different composition between a p-type GaAs contact layer 28 that is the uppermost layer of this AlGaAs-based semiconductor laser 29 and the non-doped GaAs protective layer 30 of the same GaAs system.

With this arrangement, when removal is effected by successive etching to the non-doped GaAs protective layer 33 similarly to FIG. 2D and thereafter the non-doped AlGaAs etching stop layer 42 is removed, by using an etchant of HF system or hydrochloric acid system having selectivity to the GaAs layer, the etching can be stopped when the p-type GaAs contact layer 28 is exposed. That is, the thickness of the p-type GaAs contact layer 28 can be strictly controlled, and the prescribed contact characteristic can be obtained.

(Second Embodiment)

The present embodiment is to completely leave the buffer layer of the semiconductor laser formed at the first time and carry out second-time crystal growth for the formation of a semiconductor laser on the layer.

Figure 5A:
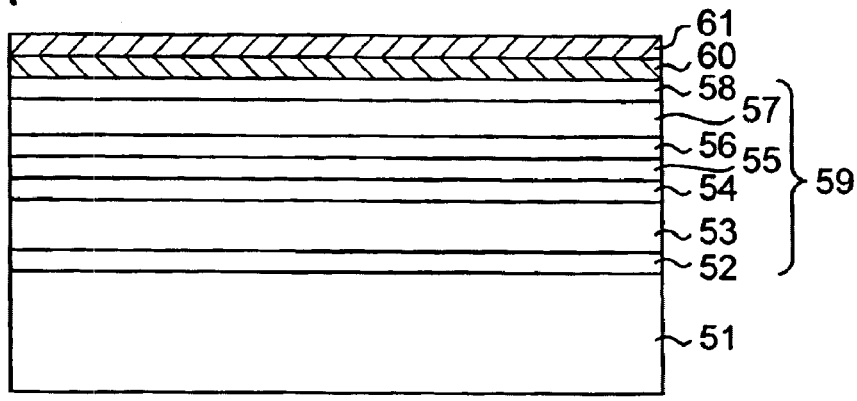
FIGS. 5A through 5C are sectional views of a semiconductor laser device formed by a semiconductor laser device fabricating method different from that of FIGS. 1A through 1C and 2D through 2F, in the fabricating processes.

FIGS. 5A through 5C and 6D through 6F show the cross sections of a semiconductor laser device formed by the semiconductor laser device fabricating method of the present embodiment, in the fabricating processes of the device. First of all, as shown in FIG. 5A, an n-type GaAs buffer layer 52, an n-type AlGaAs clad layer 53, an AlGaAs guide layer 54, a multiple quantum well active layer 55, a p-type AlGaAs guide layer 56, a p-type AlGaAs clad layer 57 and a p-type GaAs contact layer (doped with Zn) 58 are successively formed on an n-type GaAs substrate 51 by MOCVD, forming an AlGaAs-based semiconductor laser 59.

Further, a non-doped AlGaAs etching stop layer 60 having a film thickness of 0.1 µm and a non-doped GaAs protective layer 61 having a film thickness of 0.2 µm are grown on the p-type GaAs contact layer 58 of the AlGaAs-based semiconductor laser 59. Thus, first-time crystal growth is carried out.

Figure 5B:
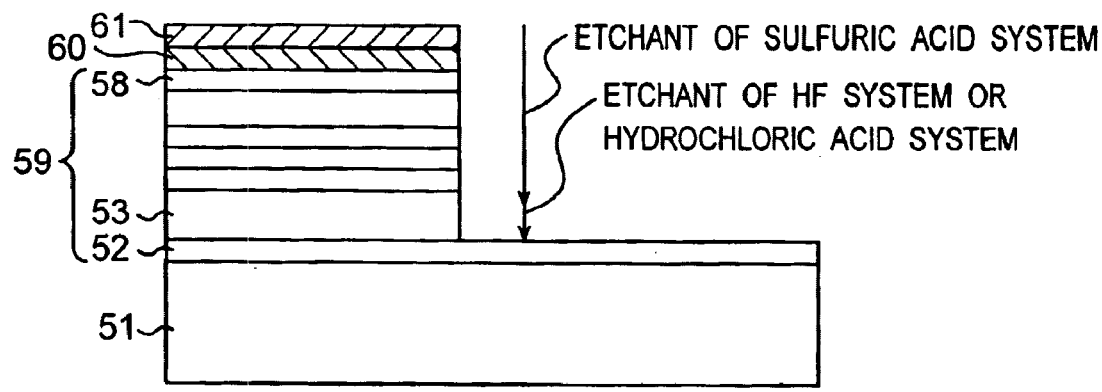

Next, as shown in FIG. 5B, a partial region of the AlGaAs-based semiconductor laser 59 is removed by etching until the n-type AlGaAs clad layer 53 to expose the n-type GaAs buffer layer 52. In concrete, etching is first carried out until reaching the n-type AlGaAs clad layer 53 with an etchant of sulfuric acid system. Next, the remaining n-type AlGaAs clad layer 53 is removed by etching with an etchant of HF system or hydrochloric acid system. Since GaAs cannot be etched with the above etchant, the etching stops at the surface of the n-type GaAs buffer layer 52. Thus, the n-type GaAs buffer layer 52 is exposed.

Figure 5C:
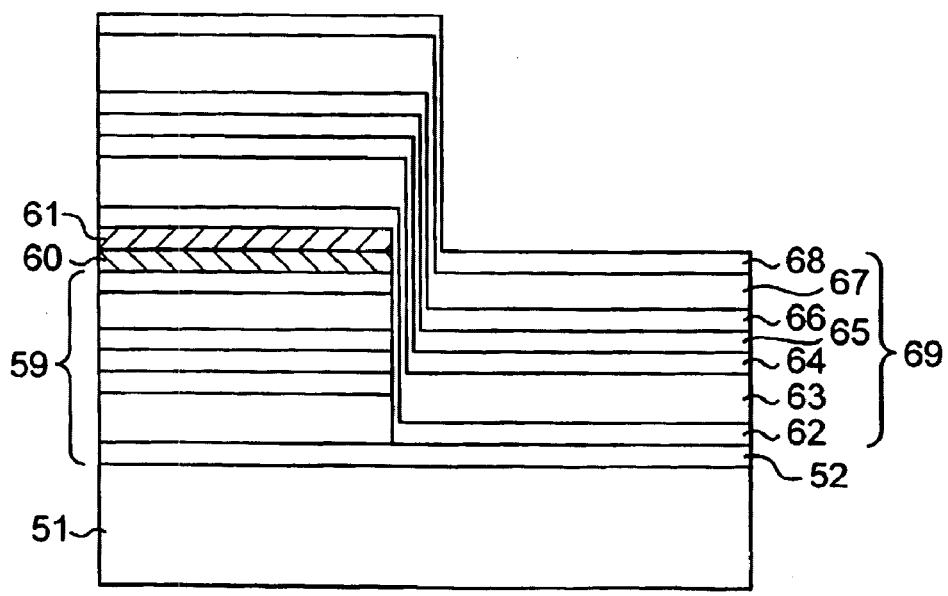
Figure 8A:
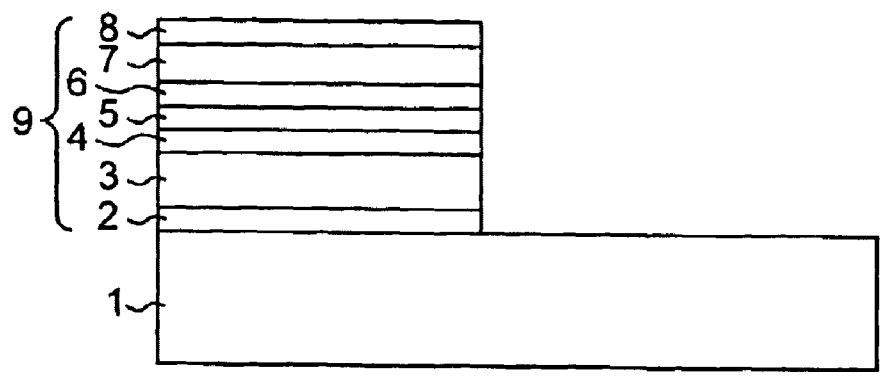
FIGS. 8A and 8B are sectional views of two semiconductor lasers grown on a substrate by a background art.
Figure 8B:
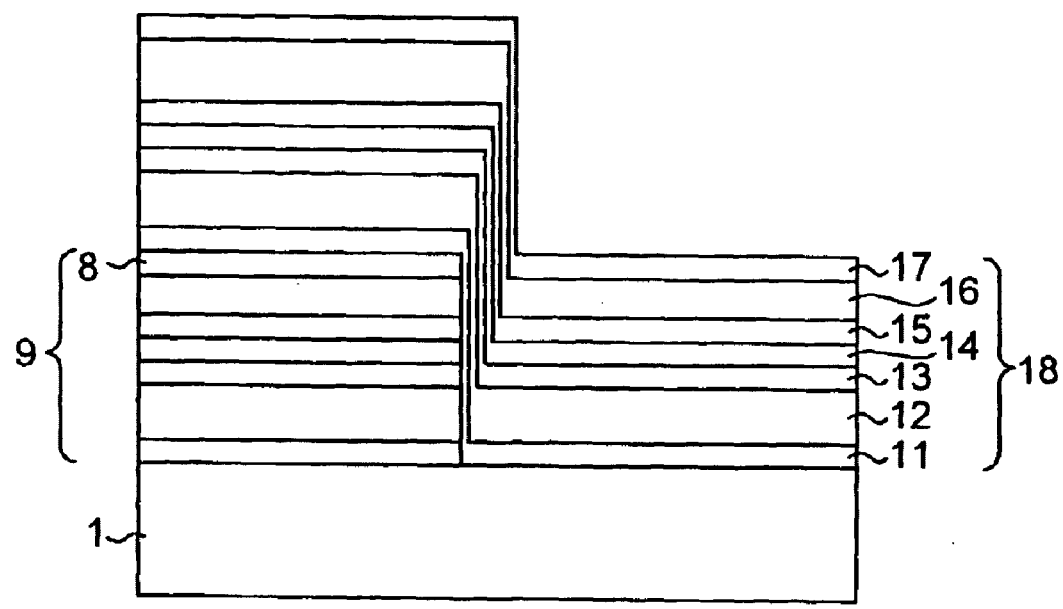

Next, as shown in FIG. 5C, an n-type GaAs buffer layer 62, an n-type AlGaInP clad layer 63, an AlGaInP guide layer 64, a multiple quantum well active layer 65, an AlGaInP guide layer 66, a p-type AlGaInP clad layer 67 and a p-type GaAs contact layer 68 are successively grown on the entire surface by MBE (Molecular Beam Epitaxy), forming an AlGaInP-based semiconductor laser 69. Thus, second-time crystal growth is carried out.

Next, as shown in FIG. 6D, a region, which belongs to the AlGaInP-based semiconductor laser 69 and is formed while being superposed on the precedingly formed AlGaAs-based semiconductor laser 59, the non-doped AlGaAs etching stop layer 60 and the non-doped GaAs protective layer 61 are removed by etching.

In concrete, etching is first carried out until reaching the n-type AlGaInP clad layer 63 of the AlGaInP-based semiconductor laser 69 with an etchant of sulfuric acid system. Next, the remaining n-type AlGaInP clad layer 63 is etched to the n-type GaAs buffer layer 62 with an etchant of hydrochloric acid system or phosphoric acid system. In this case, since the etchant having selectivity is used, the etching stops on the n-type GaAs buffer layer 62. Subsequently, the n-type GaAs buffer layer 62 and the non-doped GaAs protective layer 61 are removed by etching with an etchant of sulfuric acid system or $NH_3$ system. In this case, since the etchant of sulfuric acid system or $NH_3$ system is used, the etching stops when the non-doped AlGaAs etching stop layer 60 is exposed. Subsequently, the non-doped AlGaAs etching stop layer 60 is removed with an etchant of HF system or hydrochloric acid system. Thus, the p-type GaAs contact layer 58 of the AlGaAs-based semiconductor laser 59 is exposed.

Further, a portion located at the boundary between the AlGaAs-based semiconductor laser 59 and the AlGaInP-based semiconductor laser 69 on the n-type GaAs substrate 51 is removed until the n-type GaAs substrate 51 is exposed, forming a semiconductor laser device in which the AlGaAs-based semiconductor laser 59 and the AlGaInP-based semiconductor laser 69 are arranged parallel on the n-type GaAs substrate 51, as shown in FIG. 6E. In this case, it is, of course, acceptable to leave the n-type GaAs buffer layer 52 at the boundary between the AlGaAs-based semiconductor laser 59 and the AlGaInP-based semiconductor laser 69.

Subsequently, as shown in FIG. 6F, the p-type GaAs contact layer 58 and the p-type AlGaAs clad layer 57 of the AlGaAs-based semiconductor laser 59 are removed by etching entirely and partway, respectively, forming a ridge portion. At the same time, the p-type GaAs contact layer 68 and the p-type AlGaInP clad layer 67 of the AlGaInP-based semiconductor laser 69 are removed by etching entirely and partway, respectively, forming a ridge portion. Then, p-type AuZn/Au/Mo/Au electrodes 70 and 71 are formed on the ridge portion of the AlGaAs-based semiconductor laser 59 and on the ridge portion of the AlGaInP-based semiconductor laser 69. Further, an n-type AuGe/Ni/Mo/Au electrode 72 is formed on the surface of the n-type GaAs substrate 51. Thus, the semiconductor laser device, which has two light-emitting portions, is formed.

Figure 7:
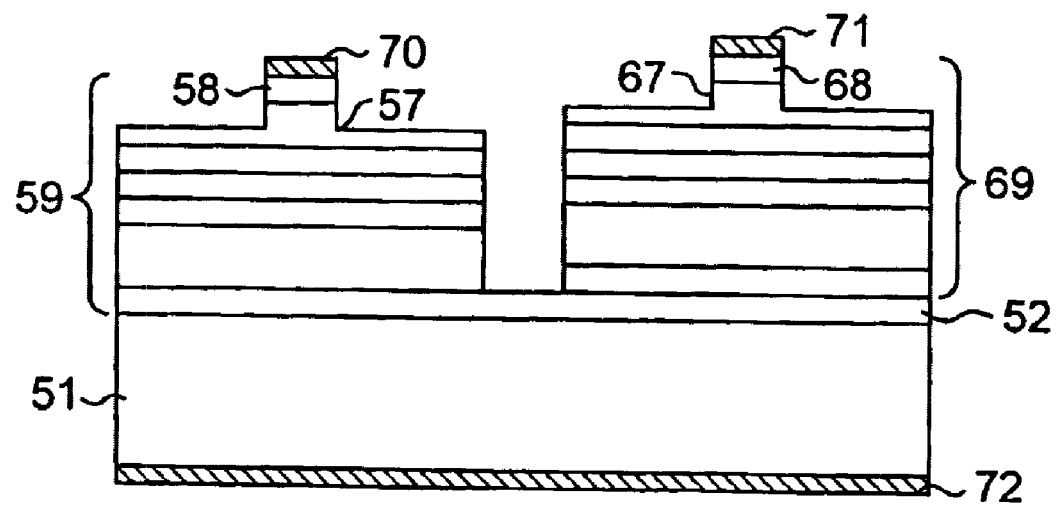
FIG. 7 is a sectional view showing another example of a semiconductor laser device formed by the fabricating method of the semiconductor laser device shown in FIGS. 5A through 5C and 6D through 6F.

When the n-type GaAs buffer layer 52 is left at the boundary between the AlGaAs-based semiconductor laser 59 and the AlGaInP-based semiconductor laser 69 as described above, a semiconductor laser device as shown in FIG. 7 is formed.

As described above, in the present embodiment, the AlGaAs-based semiconductor laser 59 is formed on the n-type GaAs substrate 51, and thereafter, etching is carried out until reaching the n-type AlGaAs clad layer 53 from the surface. Next, the n-type AlGaAs clad layer 53 is removed by etching with the etchant of HF system or hydrochloric acid system having selectivity to GaAs.

Therefore, the n-type GaAs buffer layer 52 of the AlGaAs-based semiconductor laser 59 formed at the first time on the n-type GaAs substrate 51 can be completely left, allowing the flatness of the groundwork layer to be maintained during growing the AlGaInP-based semiconductor laser 69 at the second time. Thus, the flatness of the groundwork layer can be improved in comparison with the case where the n-type GaAs substrate 51 is exposed by removing by etching the n-type GaAs buffer layer 52, and the flatness of the crystals of, in particular, the active layer grown at the second time can be improved.

That is, according to this embodiment, the poor characteristic of the AlGaInP-based semiconductor laser 69 that is grown and formed at the second time attributed to the poor flatness of the groundwork layer can be improved.

Furthermore, the AlGaAs-based non-doped etching stop layer 60 of the different composition is provided between the p-type GaAs contact layer 58, which is the uppermost layer of the AlGaAs-based semiconductor laser 59 grown and formed at the first time, and the non-doped GaAs protective layers 61 of the same GaAs system. Therefore, by using an etchant of HF system or hydrochloric acid system having selectivity to the GaAs layer when the non-doped AlGaAs etching stop layer 60 is removed, the etching can be stopped when the p-type GaAs contact layer 58 is exposed. That is, the thickness of the p-type GaAs contact layer 58 can be strictly controlled, and the prescribed contact characteristic can be obtained.

In the second embodiment, the n-type GaAs buffer layer 52 of the AlGaAs-based semiconductor laser 59 and the n-type GaAs buffer layer 62 of the AlGaInP-based semiconductor laser 69 formed on the layer have same crystal composition. Therefore, in the above case, it is acceptable to simplify the second-time crystal growth by omitting the growth of the n-type GaAs buffer layer 62 for the second semiconductor laser layer.

Moreover, in the second embodiment, the non-doped AlGaAs etching stop layer 60 and the non-doped GaAs protective layer 61 are grown on the p-type GaAs contact layer 58 of the AlGaAs-based semiconductor laser 59. However, it is acceptable to omit the formation of the non-doped AlGaAs etching stop layer 60 similarly to the first embodiment.

Moreover, each of the aforementioned embodiments have been described taking the case where two semiconductor laser layers are formed on an identical semiconductor substrate as an example. However, it is also possible to form three or more semiconductor laser layers on an identical semiconductor substrate by repetitively combining the processes described in connection with the embodiments. For example, in removing the AlGaInP-based semiconductor laser 69 on the AlGaAs-based semiconductor laser 59 in FIG. 6D, a partial region of the AlGaInP-based semiconductor laser 69 on the n-type GaAs substrate 51 is removed while leaving the n-type GaAs buffer layer 52 or the n-type GaAs buffer layer 62. Subsequently, if the processes of FIG. 5C to FIG. 6F are carried out regarding the AlGaInP-based semiconductor laser layer 69 formed at the second time as the semiconductor laser layer formed at the first time, then three semiconductor laser layers can be formed on an identical n-type GaAs substrate 51.

Moreover, the present invention is limited to neither of the aforementioned embodiments, and it is, of course, acceptable to variously combine the growth methods, the crystal compositions and the conductive types with one another.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device in which a plurality of semiconductor laser layers are arranged in parallel on a semiconductor substrate, wherein a first of the plurality of semiconductor laser layers has in its lowermost layer a buffer layer which is connected with a buffer layer of a second of the plurality of semiconductor laser layers, and the buffer layer of the first of the semiconductor laser layers is etched so as to be thinner than the buffer layer of the second of the semiconductor laser layers.

2. A semiconductor laser device, comprising:

a semiconductor substrate; and a plurality of semiconductor lasers, each laser having a plurality of layers, wherein the plurality of semiconductor lasers are arranged in parallel on the semiconductor substrate;

wherein a lowermost layer of a first one of the plurality of semiconductor lasers and the lowermost layer of a second one of the plurality of semiconductor lasers are a single buffer layer, and a portion of the buffer layer that is the lowermost layer of the first one of the plurality of semiconductor lasers is etched such that it has a thickness less than a thickness of a portion of the buffer layer that is the lowermost layer of the second one of the plurality of semiconductor lasers.

3. The semiconductor laser device as claimed in claim 2, wherein the buffer layer is a GaAs buffer layer.

* * * * *

UNITED STATES PATENT AND TRADEMARK OFFICE
CERTIFICATE OF CORRECTION

PATENT NO. : 7,034,341 B2  Page 1 of 1
APPLICATION NO. : 10/412280
DATED : April 25, 2006
INVENTOR(S) : Keisuke Miyazaki It is certified that error appears in the above-identified patent and that said Letters Patent is hereby corrected as shown below:

IN THE TITLE:  On Title Page, Col. 1 Item (54)

Please change "SEMICONDUCTOR LASER DEVICE HAVING A MULTI-LAYER BUFFER LAYER" to -- SEMICONDUCTOR LASER DEVICE HAVING A MULTI-LEVEL BUFFER LAYER --

Signed and Sealed this

Fifth Day of September, 2006

JON W. DUDAS
*Director of the United States Patent and Trademark Office*